US007328385B2

(12) United States Patent
Warren, Jr. et al.

(10) Patent No.: US 7,328,385 B2
(45) Date of Patent: Feb. 5, 2008

(54) METHOD AND APPARATUS FOR MEASURING DIGITAL TIMING PATHS BY SETTING A SCAN MODE OF SEQUENTIAL STORAGE ELEMENTS

(75) Inventors: Robert William Warren, Jr., Loveland, CO (US); Paul Joseph Huelskamp, Saint Paul, MN (US); Bradley Allen MacMonagle, Longmont, CO (US)

(73) Assignee: Seagate Technology LLC, Scotts Valley, CA (US)

( * ) Notice: Subject to any disclaimer, the term of this patent is extended or adjusted under 35 U.S.C. 154(b) by 322 days.

(21) Appl. No.: 10/912,375

(22) Filed: Aug. 5, 2004

(65) Prior Publication Data
US 2006/0031728 A1 Feb. 9, 2006

(51) Int. Cl.
*G01R 31/28* (2006.01)
(52) U.S. Cl. ............... 714/726; 714/727; 714/729; 714/30; 327/199; 327/202
(58) Field of Classification Search ............... None
See application file for complete search history.

(56) References Cited

U.S. PATENT DOCUMENTS

| 4,868,430 A | | 9/1989 | Stewart |
| 5,592,493 A | * | 1/1997 | Crouch et al. ............... 714/729 |
| 5,717,700 A | | 2/1998 | Crouch et al. |
| 5,721,740 A | | 2/1998 | Moon et al. |
| 5,774,473 A | * | 6/1998 | Harley ............... 714/30 |
| 5,784,384 A | * | 7/1998 | Maeno ............... 714/726 |
| 5,920,575 A | * | 7/1999 | Gregor et al. ............... 714/726 |
| 6,023,179 A | | 2/2000 | Klass |
| 6,108,807 A | * | 8/2000 | Ke ............... 714/726 |
| 6,233,528 B1 | | 5/2001 | Lai et al. |
| 6,272,439 B1 | | 8/2001 | Buer et al. |
| 6,334,200 B1 | | 12/2001 | Fujiwara et al. |
| 6,356,487 B1 | | 3/2002 | Merritt |
| 6,496,030 B1 | | 12/2002 | Kaneko |
| 6,567,943 B1 | * | 5/2003 | Barnhart et al. ............ 714/727 |

(Continued)

OTHER PUBLICATIONS

IBM Technical Disclosure, Aug. 1, 1990, "Maskable Transition Latch for Delay Testing", Bulletin # NB9008121, vol. 33, Issue 3B, pp. 121-122.*

*Primary Examiner*—John P Trimmings
(74) *Attorney, Agent, or Firm*—David K. Lucente; Derek J. Berger

(57) ABSTRACT

A method and apparatus are provided for performing on-board, in-circuit, and/or wafer level scan-based testing of integrated circuits. With the apparatus and method, one or more sequential storage elements, e.g., flip/flops, are coupled to combinational logic and are configured to have an additional port for receiving a scan mode signal. The scan mode signal sets the sequential storage element into one of two modes of operation: static mode in which the sequential storage element's output does not change on a falling edge of a scan enable signal or a transitional mode in which the sequential storage element's output is permitted to change on the falling edge. With sequential storage elements configured in this manner, a configuration scan is performed to set certain ones of the sequential storage elements into a static mode and other sequential storage elements into a transitional mode. A test pattern is then applied to the sequential storage elements and a pattern capture cycle is commenced.

21 Claims, 6 Drawing Sheets

U.S. PATENT DOCUMENTS

| | | |
|---|---|---|
| 6,587,811 B2 | 7/2003 | Schleifer et al. |
| 6,621,767 B1 | 9/2003 | Kattan |
| 2002/0124218 A1* | 9/2002 | Kishimoto .................. 714/738 |
| 2003/0149924 A1* | 8/2003 | Bedal et al. ................. 714/726 |
| 2005/0108604 A1* | 5/2005 | Wong .......................... 714/726 |

* cited by examiner

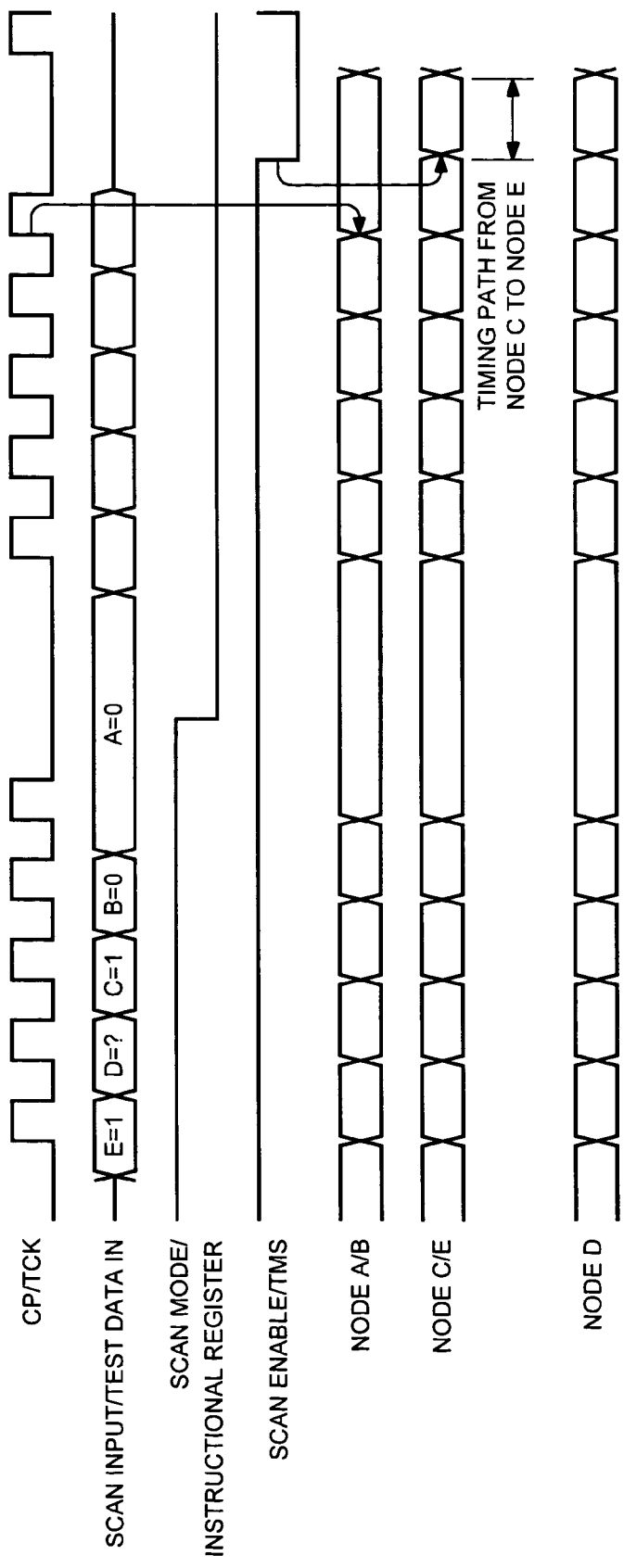

METHOD AND APPARATUS FOR MEASURING DIGITAL TIMING PATHS BY SETTING A SCAN MODE OF SEQUENTIAL STORAGE ELEMENTS

FIELD OF THE INVENTION

The present invention relates generally to embedded structures for testing integrated circuits. More particularly, the present invention relates to a method and apparatus for performing on-board, in-circuit, scan-based testing of integrated circuits in which a scan mode of sequential storage elements is set in order to measure digital timing paths.

BACKGROUND OF THE INVENTION

Historically, printed-circuit-board testing was accomplished using bed-of-nails in-circuit test equipment. However, the development of fine-pitch, high-count VLSI circuits (e.g. application specific integrated circuits) has encouraged the industry to develop test and fault detection protocols which do not require direct observability of locations within the circuitry as, for example, through the use test points and pins. The problem is further complicated by the advent of deep sub-micron technology (i.e. channel lengths no greater than about 0.5 microns) wherein faults are not only consistent with an open/short circuit fault model, but may also include faults characterized by a parasitic model, e.g., slow transitions and paths caused by, for example, particle random defects in the gate oxide, the inner-dielectric layers, or the interconnecting plugs and vias. These areas are especially vulnerable due to the geometry density and processing steps required to create them, such as chemical/mechanical planarization.

While the problems are mitigated through the use of design-for-manufacturability techniques (i.e. metal/via density), faults and defects are not entirely eliminated. Even when using redundant via interconnects, one or more of the vias could be open or incomplete thus changing the resistivity through the interconnect. Furthermore, gate oxide defects can cause degradation in a transistor's turn-on/turn-off time thus impacting overall transition time which, in turn, could damage the device and create additional performance and/or reliability problems.

The above described defect mechanisms induce parametric variations, and the best method for detecting such variations is through time analysis and production time tests. The timing induced variations are most applicable to combinatorial logic and can be screened through timing thresholds by means of either frequency functional tests or delayed fault modeling. Unfortunately, partial testing at different frequencies is globally incomplete and does not detect all internal delay-induced defects. Alternatively, additional circuitry could be provided which permits individual clock-time control.

One known solution involves the use of sequential storage elements which provides virtual access around (i.e. a sequential storage element) or within (i.e. an internal sequential storage element) circuitry by applying a stream of test vectors each comprised of serial patterns of ones and zeros to the integrated circuit device or portions thereof by means of, for example, one or more on-board shift registers deployed between blocks of combinatorial logic. The test pattern is shifted into the shift register and then into the logic circuitry to initialize the test paths of the logic circuitry, and the response data is captured to detect faults. During standard operations, the sequential storage elements remain inactive and allow data to propagate through the logic circuitry normally. However, during a test mode, the test pattern signals are preloaded into the shift register flip-flops, applied to the inputs of the logic elements for testing down-stream logic devices, and presented to the capture mechanism.

Obviously, to be effective, the time at which the scan pattern signals are applied to the logic inputs must be precisely determinable in order to accurately calculate the transition times and propagation delays of the individual logic elements and paths. For example, if two or more logical ones are shifted through adjacent bits of the shift register, a logical 1 may be applied to the input of the capture mechanism for more than one successive clock period. An increase in the path resistance manifested as increased delay might not be detected because the signal being captured by the capture mechanism may have commenced as a result of a previously shifted level.

One solution to this problem is provided in Bedal et al., U.S. Patent Application Publication No. 2003/0149924, entitled "Method and Apparatus for Detecting Faults on Integrated Circuits," published Aug. 7, 2003, which is hereby incorporated by reference. In the mechanism described in Bedal et al, a sequential storage element is provided for use in a device for testing integrated circuits. The sequential storage element includes a multiplexer and a switching device. The multiplexer provides a first signal to the switching device when the control signal is in a first state and a test signal to the switching device when the control signal is in a second state.

In a test operation, a scan pattern is stored in a first plurality of input sequential storage elements configured as described above. This scan pattern is then presented to the logic circuit when the control signal is in the first state. The scan pattern is inverted when the control signal transitions from its first state to its second state to create a measuring edge. The output of the logic circuit is then captured in a plurality of output sequential storage elements and the delay between the measuring edge and the capture is measured to determine propagation delay.

This type of testing is referred to as a static test because the input signal is sent as a minimum on a previous clock pulse but may also have been available several clock pulses prior. These static tests offer a proven structured approach to static faults. However, it cannot be determined whether each path through the combinational logic of the integrated circuit is operating within their acceptable delay range. Therefore, it would be desirable to have a method and apparatus that permits isolation of individual paths within an integrated circuit so that timing delay along the path may be accurately tested.

SUMMARY OF THE INVENTION

The present invention relates to measuring digital timing paths and, more specifically, to mechanisms for interconnect delay testing in an integrated circuit. More specifically, the present invention provides a method and apparatus for performing on-board, in-circuit, scan-based testing of integrated circuits in which a scan configuration is set in order to measure digital timing paths. In this way, isolation of paths through the integrated circuit under test may be performed through external control.

With the present invention, one or more sequential storage elements, e.g., flip/flops, are coupled to combinational logic. The sequential storage elements are configured to have an additional port for receiving a scan mode signal. The scan mode signal is utilized to set the sequential storage element into one of two modes of operation, static mode or transitional mode. In static mode, the sequential storage element's output does not change on a falling edge of a scan enable signal. In transitional mode, the sequential storage element's output is forced to change on a falling edge of the scan enable signal.

With sequential storage elements configured in the manner previously described, a configuration scan is performed to set certain ones of the sequential storage elements into a static mode and one or more other sequential storage elements into a transitional mode. A test pattern is then applied to the sequential storage elements. Thereafter, a pattern capture cycle is commenced to determine the output pattern of the integrated circuit.

As mentioned above, in order to facilitate the setting of the sequential storage elements into either a static or transitional mode, a new scan mode port is added to the sequential storage elements. Input through this new scan mode port (SM) determines if a scan in (SI) signal will go to a configuration latch. This configuration latch determines if the sequential storage element will be static or transitional. This allows complete external control over the timing path. Isolation of a timing path is made possible by setting sequential storage elements that are not part of the targeted timing path to a static mode and setting a sequential storage element associated with the targeted timing path to a transitional mode.

In another embodiment of the present invention, the sequential storage element may be configured to include an additional input referred to as the scan config signal that is used, along with the scan mode input, to control the test pattern timing. With this alternative embodiment, the rising edge of the scan mode signal starts the timing of the test pattern rather than the falling edge of a scan enable signal. This embodiment allows the sample clock to clock multiple times and the scan mode signal to be controlled in a less timing critical manner.

In yet another embodiment of the present invention, the sequential storage element is configured such that the test pattern that is scanned into the sequential storage elements may place a desired result in the sequential storage element for comparison to a captured value, which is captured in a "sample" latch. The captured value matches the desired result, a next clock cycle causes the expected value to invert. This operation may continue for any number of clock cycles. This allows a path to be measured multiple times. If during the capture cycles the two signal values disagree, the captured value is latched as a zero and the config latch is changed to zero.

This freezes any further capture updates to the "sample" latch.

These and various other features as well as advantages which characterize the present invention will be apparent upon reading of the following detailed description and review of the associated drawings.

BRIEF DESCRIPTION OF THE DRAWINGS

FIG. 7 is a timing diagram of the integrated circuit configuration shown in FIG. 4 where the sequential storage elements are implemented using the sequential storage element of FIG. 6.

DETAILED DESCRIPTION

Figure 1:
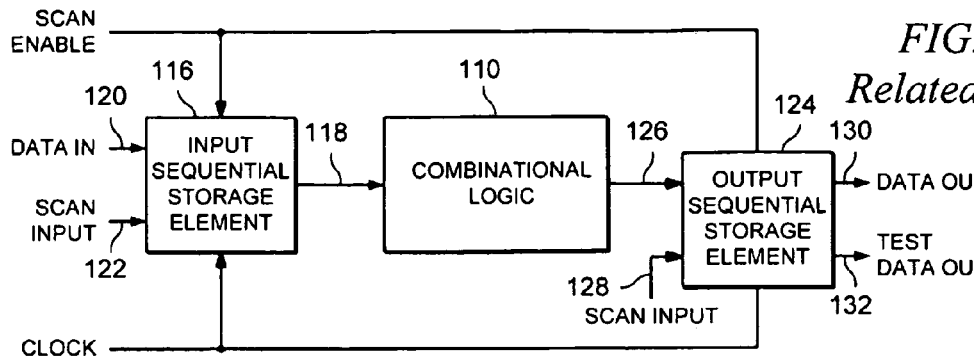
FIG. 1 is an exemplary functional block diagram illustrating the input and output structure of a simple known sequential storage element configuration.

FIG. 1 is a simplified block diagram illustrating a basic known scan device for providing onboard scan-based testing and fault detection for combinatorial and sequential logic circuits. Combinatorial logic circuit 110 may generally include input logic circuitry and output logic circuitry. An input sequential storage element (ISSE) 116 is shown as having an output 118 which is applied to combinational logic circuit 110. The data appearing at output 118 may be legitimate data which is to be processed by combinational logic circuit 110 or may be test data in the form of a scan pattern, which is utilized to determine if combinational logic circuit 110 is performing properly. Input sequential storage element 116 has a first input 120 for receiving legitimate data-in (DI) and a second input 122 which receives a scan input (SI) which consists of a stream of test vectors each comprised of serial patterns of ones and zeros.

An output sequential storage element (OSSE) 124 has a first input 126 that is coupled to receive a signal from combinational logic circuit 110 and also includes a scan input 128 as did input sequential storage element 116. As can be seen, output sequential storage element 124 has a first output 130 corresponding to legitimate data-out (DO) and a second output 132 corresponding to test data-out (TDO). Both input sequential storage element 116 and output sequential storage element 124 have a third input for receiving a clock signal (CK) and a fourth input for receiving a scan enable signal (SE) which places both input sequential storage element 116 and output sequential storage element 124 in a test mode. Thus, during normal operations, input sequential storage element 116 and output sequential storage element 124 permit data to be propagated through combinational logic circuit 110 in a normal manner. However, during test modes, test data, i.e. scan input (SI), is applied to combinational logic circuit 110 via input sequential storage element 116, and the result of the test is captured in output sequential storage element 124 and made available at test data output (TDO) 132.

Figure 2:
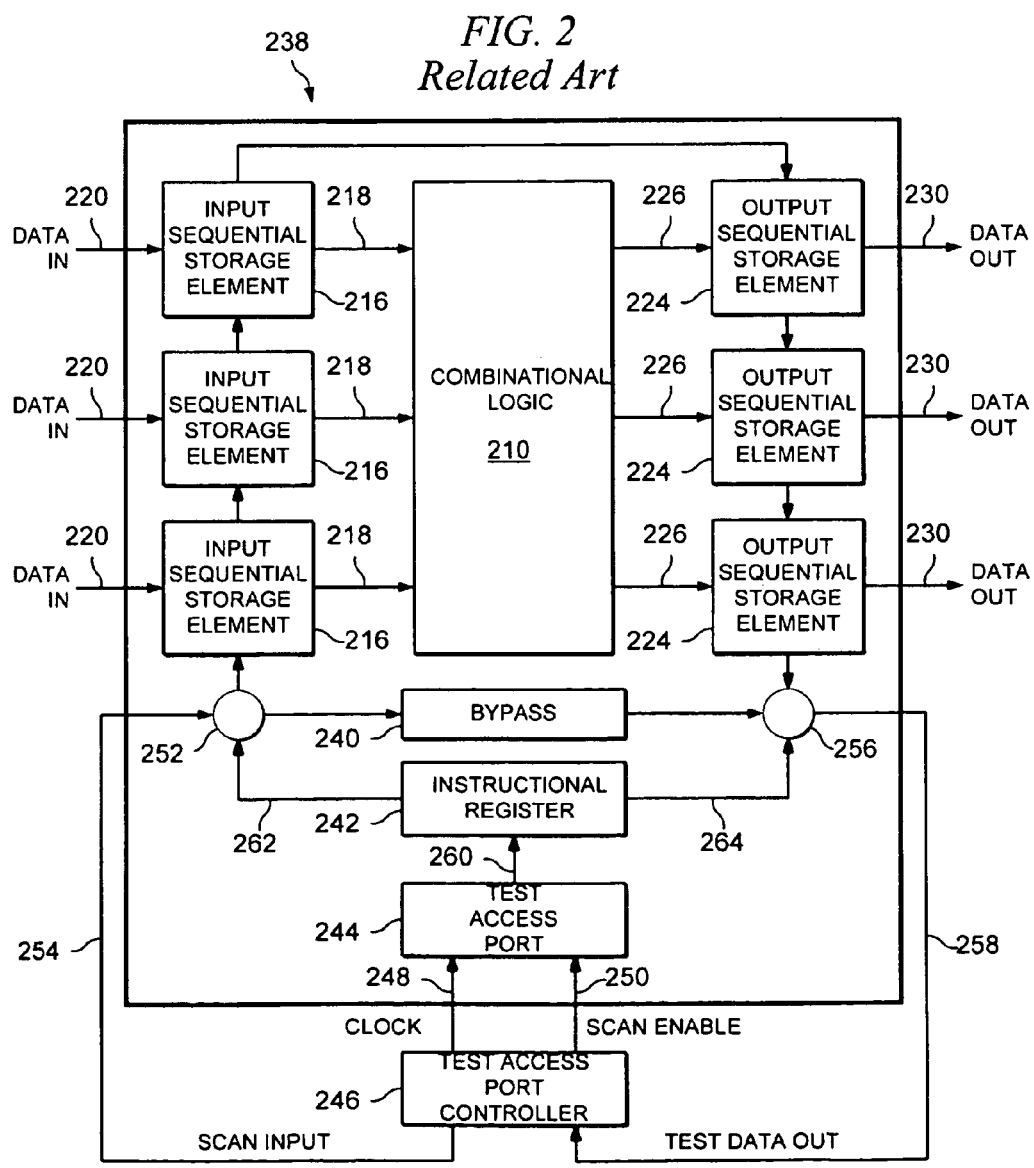
FIG. 2 is an exemplary block diagram of a scan device comprising a plurality of input sequential storage elements having outputs coupled to a logic circuit and a plurality of output sequential storage elements for receiving signals from the logic circuit.

FIG. 2 is a functional block diagram that shows a scan device 238 comprising a plurality of input sequential storage elements 216 having outputs 218 coupled to logic circuit 210 and a plurality of output sequential storage elements 224 for receiving signals 226 from combinational logic circuit 210. As previously described in connection with of FIG. 1, each input sequential storage element 216 has a data input 220 and an output signal 218. Similarly, each output sequential storage element 224 receives a signal 226 from combinational logic circuit 210 and provides a data out signal 230.

The device shown in FIG. 2 further includes bypass circuit 240, instruction register 242, test access port (TAP) 244, and test access port controller 246. As can be seen, test access port controller 246 provides a clock signal (CK) to test access port 244 over line 248, a scan enable signal (SE) to test access port 244 over line 250, scan input data (SI) to combination nodes 252 over line 254, receives output test data (TDO) from combination node 256 over line 258, and performs the required measurements and calculations (e.g., propagation delay through logic 210). Instruction register 242 is coupled to test access port 244 as is shown at 260, and instruction register 242 provides inputs to combination nodes 252 and 256 over lines 262 and 264 respectively. Test access port 244, in conjunction with test access port controller 246, controls the basic operation of the device by generating the clock signal (CK), the scan enable signal (SE), the test data or scan input data (SI) and receiving the test data out (TDO).

Instruction register 242 generates instructions in response to signals received from test access port 244 which indicate how the device is to perform. For example, instruction register 242 may place the device into an external boundary test mode and select the boundary scan register to be connected between the SI output 254 and the TDO input 258. Sequential storage elements 216 and 224 are then preloaded with test patterns in order to test logic circuitry 210. Input sequential storage elements 216 capture the input test vectors for application to combinational logic circuitry 210 when in the test mode.

The device's scan chain can be bypassed through the use of bypass register 240. Bypass register 240 allows data to pass through without incurring the additional overhead of traversing through other devices. Thus, the device can remain in a functional mode by selecting a bypass register to be coupled between the SI data applied to combination node 252 and the output test data originating at combination node 256. This allows serial data to be transferred through the device from combination nodes 252 to combination node 256 without impacting the operation of the overall device.

It should be clear that the block diagram shown in FIG. 2 has been simplified for the sake of explaining and understanding the present invention. For example, it should be clear that the clock signal (CK) and the scan enable signal (SE) are applied to each of the input sequential storage elements and output sequential storage elements as shown in FIG. 1. However, for the sake of convenience, they are shown as being applied only to test access port 244. Finally, it can be seen that scan data (SI) comprising a test vector which includes a pattern of ones and zeros is applied to combination node 252 over line 254 and is shifted through each of the input sequential storage elements 216 and output sequential storage elements 224 in order to precondition logic circuit 210.

The techniques described above in connection with the use of scan as a methodology permitting complete controllability and observability of an integrated circuit's boundary pins under software control is well known. For example, see U.S. Patent Publication No. 2003/0149924 and the white paper entitled "Introduction to JTAG Boundary Scan," dated January 1997 provided by Sun MicroElectronics. For additional information, see U.S. Pat. No. 6,092,226 entitled "Fabrication of Test Logic for Level Sensitive Scan on a Circuit" issued Jul. 18, 2000 and U.S. Pat. No. 6,150,807 entitled "Integrated Circuit Architecture having Array of Test Cells Providing Full Controllability for Automatic Circuit Verification" issued Nov. 21, 2000.

Figure 3:
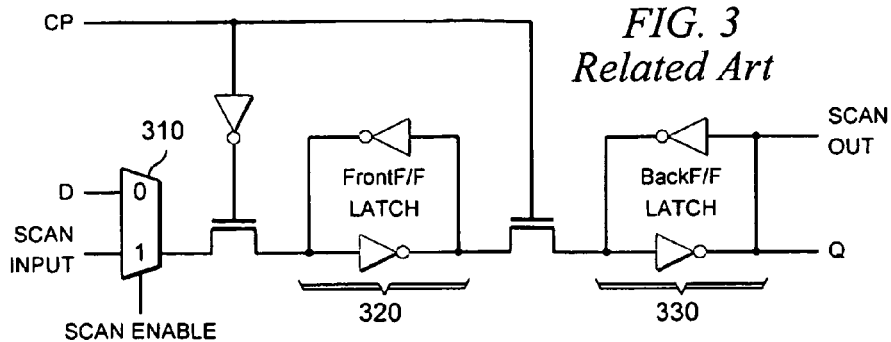
FIG. 3 is an exemplary circuit diagram of a known sequential storage element such as those illustrated in FIG. 1.

FIG. 3 is a logic diagram of a typical sequential storage element in accordance with the prior art. As shown in FIG. 3, the sequential storage element receives four inputs, i.e. a clock pulse (CP), a data input (D), a scan input (SI), and a scan enable signal (SE). The sequential storage element generates two outputs, a scan out (SO) signal and a data output (Q) signal. In a non-test mode of operation, the scan enable (SE) input is held low (zero). This causes the multiplexer 310, on the rising edge of the clock pulse (CP), to sample the value on the data input (D). The sampled value is stored in the front flip/flop (F/F) latch 320. The value on the scan input (SI) line is ignored.

On the falling edge of the clock pulse (CP), the value of the front flip/flop (F/F) latch 320 is transferred to the back F/F latch 330 and thus, appears on the two outputs, Q and scan out (SO). The SO signal of one sequential storage element is connected to the scan input (SI) of another sequential storage element thereby creating a serial chain of sequential storage elements through the circuit design.

In a test mode, the scan enable (SE) input is held high. The value stored into the sequential storage element comes from the scan input (SI) line and the data input (D) is ignored. This provides a method for a value to be "scanned" into the design chain. On each clock pulse, the value on the scan chain advances one sequential storage element. When all the sequential storage elements in the design have been scanned with a test pattern, the scan enable signal is held low for one clock pulse. This captures the data input (D) into the sequential storage element. The scan enable signal is then held high on the next and subsequent clock pulses as the next test pattern is scanned in and the results of the last test are scanned out.

As previously mentioned above, the sort of test that is described above with regard to FIG. 3 is a static test and thus, is not able to provide accurate timing information regarding isolated paths through an integrated circuit. The test is referred to as static because the data input (D) signal was sent as a minimum on a previous clock pulse, but may also have been available several clock pulses prior. One solution to the inability to have accurate timing information obtained using the sequential storage element of FIG. 3 is to provide additional clock pulses when the scan enable (SE) input signal is low. This requires that the automatic test pattern generation (ATPG) tools calculate the expected value based upon the circuit design. The ability to isolate and measure a timing path is determined by the designer's circuit and not the test methodology. Thus, depending upon the circuit design, a critical timing path may not be able to be isolated and tested using the mechanisms of FIG. 2 and FIG. 3.

As geometries of integrated circuits become smaller and routing densities increase, timing delay faults become a more important part of fault modeling. In addition, with the dominance on interconnect delay, cross-talk becomes a greater concern. Thus, it would be desirable to be able to isolate and test individual timing paths to determine faults, especially those due to cross-talk, i.e. one electrical signal influencing the value of another electrical signal not by a logical circuit, but rather through capacitive coupling between two parallel paths.

Figure 4:
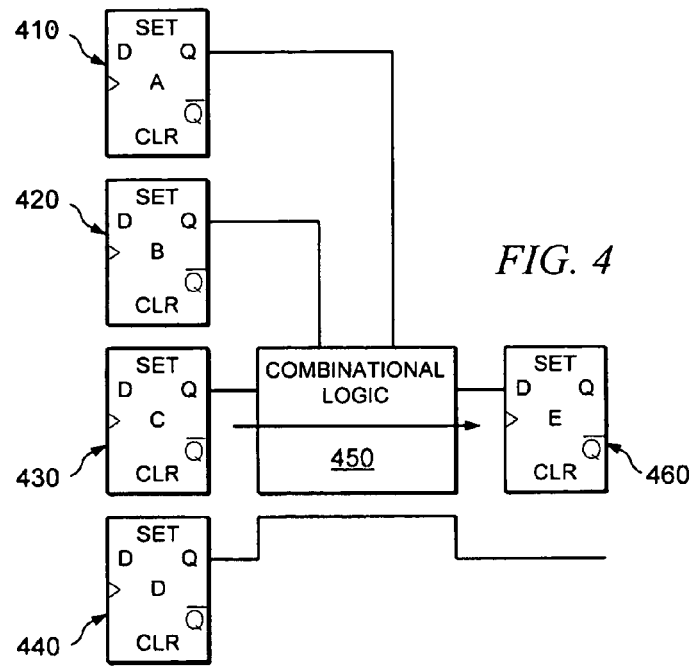
FIG. 4 is an exemplary diagram illustrating desired path isolation for delay timing in accordance with one exemplary embodiment of the present invention.

For example, FIG. 4 is an exemplary diagram illustrating a desired path isolation for delay timing in accordance with one exemplary embodiment of the present invention. In the depicted example, it would be advantageous to measure the timing path from sequential storage element C 430 to sequential storage element E 460 through combinational logic 450 while keeping sequential storage elements A 410 and B 420 stable and toggling sequential storage elements C 430 and D 440 during the C to E timing path measurement. In this way, the affect of the signal along the output from sequential storage element D 440 on the path between sequential storage element C 430 and E 460 may be determined. The present invention provides a mechanism for permitting the setting of sequential storage elements A 410, and B 420 to a stable or static state while sequential storage elements C 430 and D 440 are placed in a transitional state so that they may be toggled. Sequential storage element E 460 may be set to either a static or transitional state since it is in a "don't care" condition with regard to the timing path testing. However, from a cross-talk perspective, it would be advantageous to have Sequential storage element D 440 toggle to the opposite value expected on Sequential storage element E 460.

Figure 5:
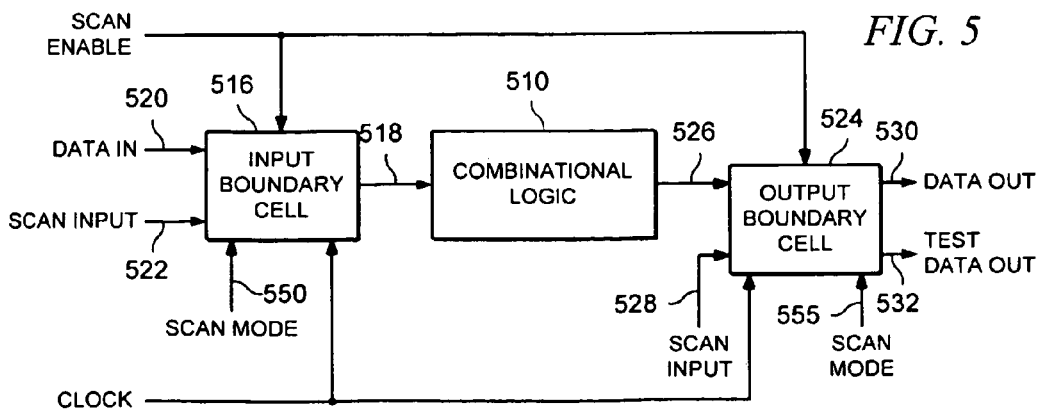
FIG. 5 is an exemplary functional block diagram illustrating an input and output structure of a sequential storage element configuration in accordance with one embodiment of the present invention.

The mechanism of the present invention permits certain sequential storage elements to be placed in a static state and others in a transitional state is an additional input port for providing a scan mode signal to the sequential storage element and a configuration latch that is used to determine whether the output (Q) of the sequential storage element toggles on the falling edge of the scan enable (SE) input signal. FIG. 5 is an exemplary functional block diagram illustrating an input and output structure of a sequential storage element configuration in accordance with one embodiment of the present invention. The input and output structure of the sequential storage element configuration shown in FIG. 5 is identical to that shown in FIG. 1 with the exception of the additional scan mode (SM) signal inputs 550 and 555 into the input sequential storage element 516 and the output sequential storage element 524. This scan mode (SM) signal 550 and 555 is used to configure the input sequential storage element 516 and the output sequential storage element 524 to be either static or transitional and thus, permits isolation of timing paths through the combinational logic 510.

Figure 6:
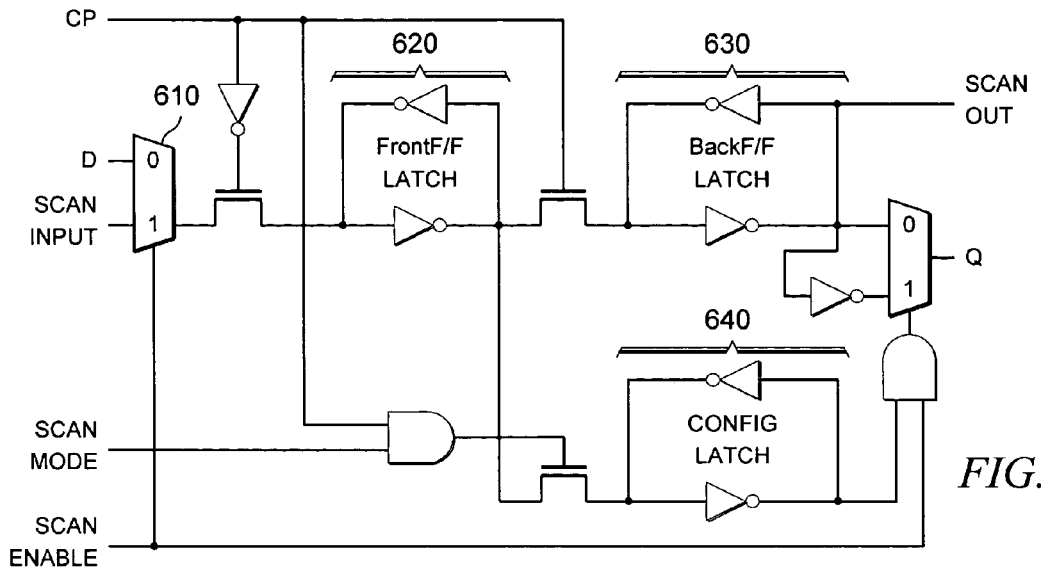
FIG. 6 is an exemplary circuit diagram of a sequential storage element in accordance with one exemplary embodiment of the present invention.

FIG. 6 is an exemplary circuit diagram of a sequential storage element in accordance with one exemplary embodiment of the present invention. As shown in FIG. 6, the sequential storage element configuration differs from that illustrated in FIG. 3 primarily by the inclusion of a scan mode (SM) input and a configuration latch 640. The other elements 610, 620 and 630 operate in a similar manner as described above with regard to corresponding elements 310, 320 and 330 in FIG. 3. The configuration latch 640 determines whether the output (Q) of the sequential storage element toggles on the falling edge of the scan enable (SE) input signal. This allows the sequential storage element to create a timing path from the falling edge of the SE input signal to the rising edge of the clock pulse (CP) signal.

With the present invention, an initial configuration scan of the sequential storage element is performed in order to set the configuration latches of the sequential storage elements to be either static or transitional. That is, the scan enable (SE) and scan mode (SM) signals are taken high in order for the scan in (SI) signal value to be latched into the configuration latch 640. If the configuration latch 640 was scanned with a zero scan in (SI) signal, the sequential storage element is set to a static mode. That is, the sequential storage element would present its scanned in (SI) value immediately as output. If the configuration latch 640 was scanned with a one scan in (SI) signal, then the sequential storage element is set to a transitional mode. That is, the output of the sequential storage element will be inverted until the scan enable (SE) input signal is taken low.

The operation of the configuration latch 640 based on the scan mode (SM) input signal provides a means whereby the external test equipment, e.g., the test access port controller 246 of FIG. 2, can control when an output signal of the sequential storage element changes. The time from the scan enable (SE) input signal going low to the time when the clock pulse goes high determine the timing path. If a signal is sampled correctly in this time, the timing path meets the timing requirements of the circuit design. If the timing path is slow, the output signal would not change in time and the sampled output signal value would be the opposite value, thereby failing the test.

FIG. 7 is a timing diagram of the integrated circuit configuration shown in FIG. 4 where the sequential storage elements are implemented using the sequential storage element of FIG. 6. With reference again to the configuration shown in FIG. 4, and as shown in FIG. 7, the sequence of events is as follows. First, the instruction register of the test access port (TAP) is scanned to set the scan mode (SM) bit (not shown). The data register is then scanned to configure the sequential storage elements as being either static or transitional. The instruction register of the TAP is then scanned to clear the scan mode bit (not shown). Thereafter, the data register is scanned to set up the circuit to enable the C-to-E path. Note that the A/B sequential storage elements will stabilize on the last rising edge of the scan data clock, i.e. clock pulse (CP).

The scan enable (SE) signal line is then cleared via an external Test Mode Select (TMS) signal. This causes sequential storage elements C and D to invert to a desired value and begin the timing measurement. The clock pulse (CP) signal is then clocked to capture the C-to-E path in the sequential storage element E. This completes the timing measurement. The captured response in sequential storage element E is then scanned out and compared with a desired result to determine if the timing path is operating appropriately.

Figure 8:
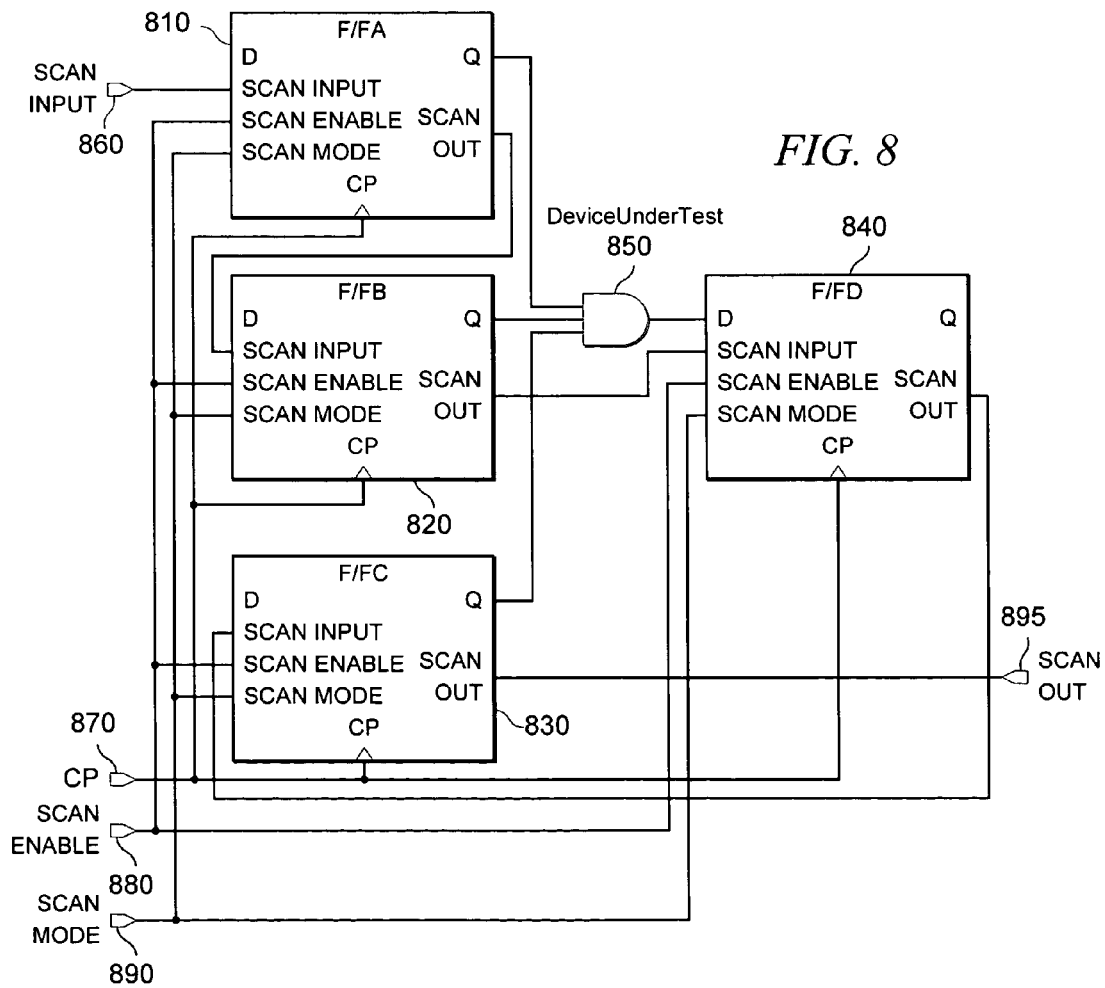
FIG. 8 is an exemplary diagram of an integrated circuit in which sequential storage elements in accordance with one exemplary embodiment of the present invention are implemented.

To provide another example of the steps that are performed in order to test a timing path through combinational logic, an exemplary circuit is illustrated in FIG. 8 in which sequential storage elements according to the present invention are utilized. As shown in FIG. 8, three input sequential storage elements 810-830, such as the input sequential storage element illustrated in FIG. 5 and FIG. 6, are provided for scanning timing paths through the device under test 850. A single output sequential storage element 840 is provided, such as the output sequential storage element illustrated in FIG. 5 and FIG. 6. A plurality of input pins 860-890 are provided for providing input signals to the sequential storage elements 810-840. An output pin 895 is provided for providing a scan output signal from sequential storage element 830.

The first step in the process for testing the timing delay along a path between sequential storage element B and sequential storage element D is to identify a fault is to scan the configuration side of the sequential storage elements 810-840. That is, the scan enable (SE) and scan mode (SM) pins are taken high (e.g., a value of 1). This permits scan in (SI) signal values to be latched into the configuration latch of the sequential storage elements.

In this example, it is desirable to have sequential storage elements A 810 and C 830 to be non-toggling (scan configuration=0) and sequential storage element B 820 to be toggling (scan configuration=1). Sequential storage element D 840 is "don't care" for this example. Therefore, with the scan chain order of A, B, D, C, the first value on the scan in (SI) signal line would be a zero (for sequential storage element C 830). After a clock pulse (CP), a zero or one would be presented for configuring sequential storage element D 840, followed by a one for configuring sequential storage element B 820, and a zero for configuring sequential storage element A 810. At this point, all of the configuration latches of the sequential storage elements 810-840 have been scanned and the scan mode (SM) input signal is taken low.

Following this configuration step, a test pattern may be applied to the circuit. The scan input (SI) signal is set to a one for the first clock pulse (CP) (directed to sequential storage element C 830), a zero (directed to sequential storage element D 840), a one (directed to sequential storage element B 820), and then another one (directed to sequential storage element A 810). At this point, the scan enable (SE) input signal is still set high. Sufficient time is allowed to allow the A-to-D and C-to-D paths to stabilize to a one. The B-to-D path is also stabilized to a zero (inverted test pattern value). The SE input signal is then taken low, causing the B-to-D path to change to a one. The rising edge of the clock pulse (CP) will capture the "one" or "high" in the sequential storage element D 840.

The sequential storage element configuration according to the above described embodiment provides a number of advantages over the known mechanisms for delay fault testing. First, the present invention provides a mechanism that provides a structured approach to isolating and measuring any or every path within a design. As stated above, the configuration scan to set the sequential storage elements to either a static state or a transitional state permits isolation of individual timing paths through the combinational logic. This isolation may be performed for each path of interest, e.g., critical paths, and thus, multiple configuration scans may be performed to test these various timing paths. In addition, the configuration scan permits all sequential storage elements except the ones associated with the path being measured to be toggled, i.e. set to a transitional state.

In addition, as mentioned above, the present invention provides added structure to the sequential storage element in terms of the scan mode port and signal line, and the circuitry required to implement the configuration latch. This additional structure may cause up to a 50 percent size increase in size of the sequential storage elements. However, as mentioned above, in smaller geometries where cell size is less of a dominant factor, this increase in sequential storage element size is less of an issue.

Moreover, the configuration of the sequential storage elements according to the present invention permits traditional ATPG stuck-at fault patterns to be run through the integrated circuit without modification. Thus, other than having to perform a single configuration scan of all zero prior to the ATPG pattern being input, there is no need to modify conventional ATPG pattern inputs while having the ability for testing timing paths.

While the above embodiment of the present invention provides an advancement over known sequential storage element configurations and mechanisms for testing of timing paths, there are some drawbacks to this embodiment. This embodiment of the present invention requires additional test time to configure and capture timing paths. Approximately twice as much test time is necessary to test a timing path using the sequential storage elements and methodology of the present invention due to the need to perform a configuration scan of the sequential storage elements prior to submitting the test pattern for testing the timing path. Moreover, the scan mode (SM) signal must be controlled in a timing critical manner in order to ensure proper testing of the timing path. Furthermore, the sequential storage element configuration described above does not permit multiple clockings of the clock pulse (CP) in order to test the timing path over multiple clock pulses. Additional embodiments, as described hereafter, have been developed for addressing these drawbacks.

Figure 9:
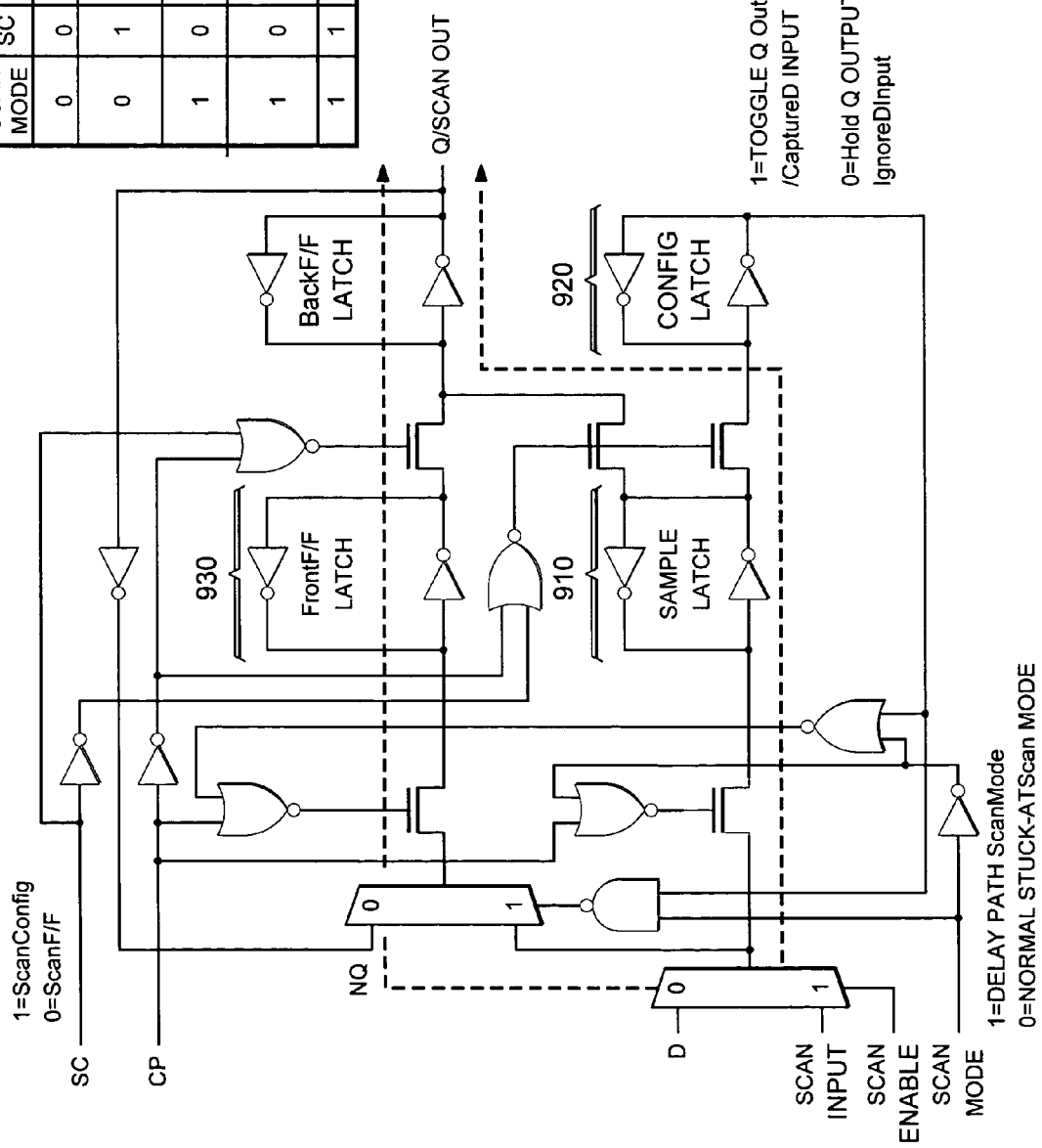
FIG. 9 is an exemplary circuit diagram of a sequential storage element in accordance with an alternative embodiment of the present invention in which multiple timing measurements are made possible.

FIG. 9 is an exemplary circuit diagram of a sequential storage element in accordance with an alternative embodiment of the present invention in which multiple clockings is made possible. In addition, the sequential storage element shown in FIG. 9 permits the scan mode (SM) signal to be controlled in a less timing critical manner.

The sequential storage element, or flip/flop, illustrated in FIG. 9 includes an additional input called the scan config (SC) input signal. When the scan config (SC) input signal is high, the data on the scan input (SI) input signal line is set to the configuration latch 920. When the scan config (SC) input signal is low, the configuration latch 920 retains its previous value. This allows the scan mode (SM) input signal to be used to control the test pattern timing. In other words, the scan config (SC) input signal controls when the scan input (SI) input signal is permitted to be latched into the configuration latch 920 for use in testing the timing path.

In addition, a sample latch 910 is also provided in this embodiment. This sample latch 910 permits the front flip/flop latch 930 to provide a toggling output (NQ input) and a capture of the D input in the sample latch 910. When the config latch 920 is set to "1", the Q output of the sequential storage element will toggle and the D input will be captured in the sample latch 910. When the config latch 920 is set to "0", the Q output will maintain it's previously scanned value and the D input will be ignored. This allows the sequential storage element to toggle certain outputs and hold other outputs. Thus, a timing delay path measurement can be made on the second capture clock pulse thereby providing a sequential storage element that permits timing measurements on two clockings of the clock pulse (CP).

In the previous embodiment of the present invention, the falling edge of the scan enable (SE) input signal determined the start of the testing of the timing path. In the present embodiment of the present invention, the rising edge of the scan mode (SM) input signal starts the testing of the timing path.

As shown in FIG. 9, when the scan mode (SM) signal is low and the scan config (SC) signal is low, the sequential storage element operates as a normal sequential storage element, i.e. as if the present invention is not being implemented within the sequential storage element. When the scan mode (SM) signal is low and the scan config (SC) signal is high, the scan input (SI) input signal data is placed into the configuration latch 920. When the scan mode (SM) signal is high, the scan config (SC) signal is low, and the config latch 920 has a stored value of "0", the Q output is held and the D input is ignored. When the scan mode (SM)

signal is high, the scan config (SC) signal is low, and the config latch 920 has a stored value of "1", the Q output is toggled and the D input is captured in the sample latch 910.

This embodiment of the present invention provides similar advantages over the known mechanisms for timing path testing as the previous embodiment described above. While the previous embodiment increases the size of sequential storage element by up to 50 percent, the present embodiment may result in up to a 100 percent increase in size of the sequential storage element. However, in smaller geometries this may not be an issue because of cell size being less dominant of a factor. In addition, this embodiment permits timing measurements to be taken over two clock pulses rather than a single clock pulse as in the previous embodiment due to the ability to hold the output of the sequential storage element. This also permits less timing critical control of the scan mode (SM) signal.

However, this embodiment, as with the previously described embodiment, still requires additional time to perform testing of the timing paths due to the necessity of having a configuration scan of the sequential storage elements to place them in either a static or transitional mode of operation. As with the previously described embodiment, this additional time makes the time for performing timing path testing approximately twice that of known testing mechanisms.

Figure 10:
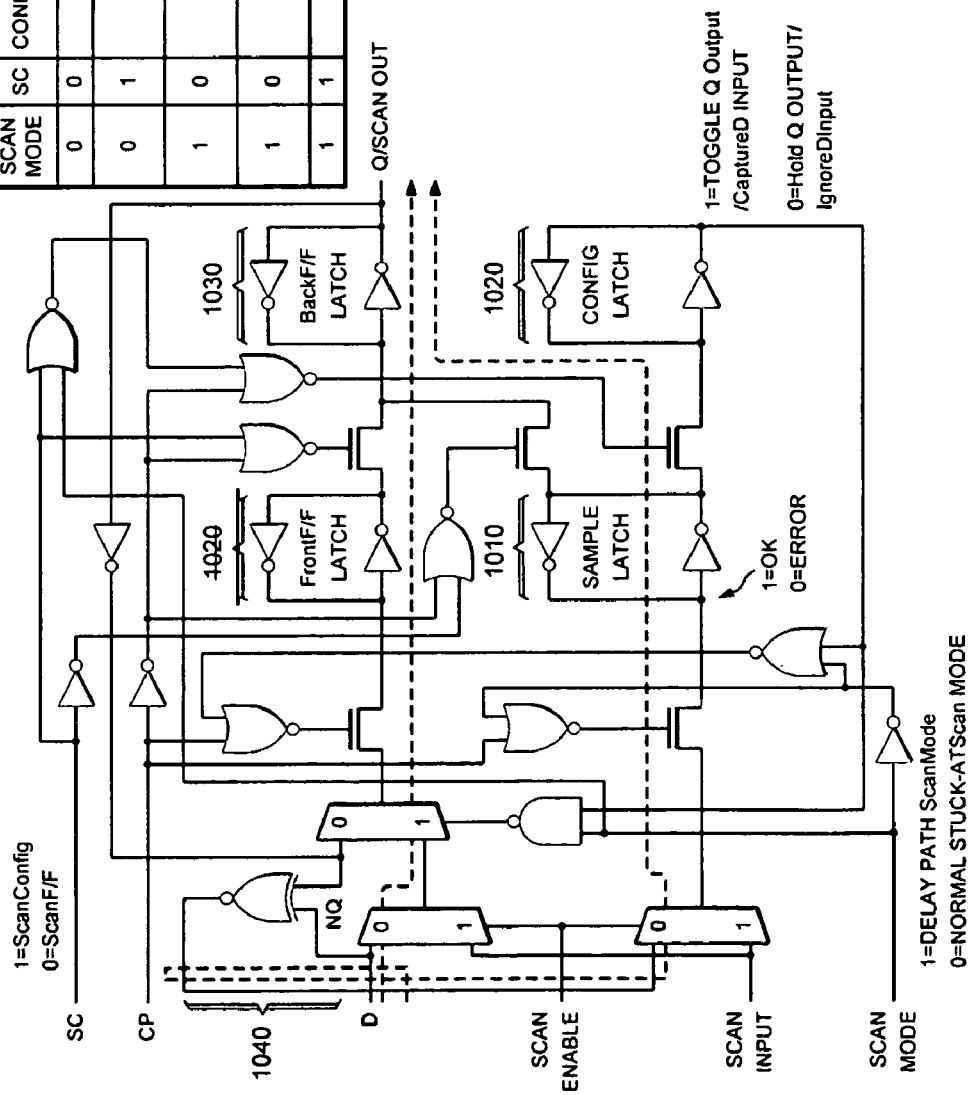
FIG. 10 is an exemplary circuit diagram of a sequential storage element in accordance with an alternative embodiment of the present invention in which the test pattern that is scanned into the sequential storage elements may place a desired result in the sequential storage element for comparison to a captured value.

FIG. 10 is an exemplary circuit diagram of a sequential storage element in accordance with an alternative embodiment of the present invention in which the test pattern that is scanned into the sequential storage elements may place a desired result in the sequential storage element for comparison to a captured value. This exemplary embodiment of the present invention attempts to overcome the increased test time of the previously described embodiments. As shown in FIG. 10, the fundamental difference between the embodiment illustrated in FIG. 9 and that in FIG. 10 is that rather than the sample latch 1010 capturing the D input, the sample latch 1010 captures the D input XNOR with NQ. This permits the test pattern to place the desired result in the sequential storage element and compare it to the captured value.

That is, the desired value is stored in the back F/F latch 1030. For example, if it is expected that the D input is to be a zero, a one may be placed into the back F/F latch 1030. On the first capture clock, the NQ side of the XNOR gate 1040 would have a zero (the Back F/F's one inverted) and the D input would have a zero. The XNOR gate 1040 would output a one (pass) that would get stored in the sample latch 1010. On the next clock pulse, both the D input and the back F/F latch 1030 would toggle and would sample a one on both sides of the XNOR gate 1040 and still retain the one output on the XNOR gate 1040. The mechanism is using the fact that this value will toggle on every clock pulse, the same as the D input, and the value is stored in the sample latch 1010. If the XNOR gate 1040 ever outputs a zero, the sample latch 1010 will store the zero and block further test samples. If the values agree, the next clock pulse causes the expected value to invert. This scenario may continue for any number of clock cycles. This allows a path to be measured multiple times. If during any of the capture cycles the two signals disagree, the sample latch 1010 value is latched as a zero and the config latch 1020 is changed to a zero. This freezes any further capture updates to the sample latch 1010.

This embodiment of the present invention provides similar advantages over the known mechanisms for timing path testing as the previous embodiment described above. While the previous embodiment increases the size of sequential storage element by up to 100 percent, the present embodiment may result in up to a 120 percent increase in size of the sequential storage element. However, in smaller geometries this may not be an issue because of cell size being less dominant of a factor and routing area and signal integrity issues creating more cell space. In addition, this embodiment permits timing measurements to be taken over multiple clock pulses rather than only one or two clock pulse as in the previous embodiments. That is, a path may be tested multiple times without requiring additional configuration scans of the sequential storage elements.

Most importantly, because this embodiment permits multiple capture clock cycles, the test time is similar to that of traditional ATPG patterns. That is, only two scans are required per test, but multiple capture clock cycles are possible with each test. For example, if 1000 sequential storage elements are used to test combinational logic, each test would require 2001 clock cycles to test a timing path (1000 clock cycles to configure the sequential storage elements, 1000 clock cycles to scan in the test pattern, and 1 clock cycle to capture the output). Therefore, if three tests of the timing path were to be conducted, it would require 6003 clock cycles to complete. With the present invention, these same three tests of the timing path may be obtained within 2003 clock cycles since the configuration scans need not be repeated (1000 clock cycles to configure the sequential storage elements, 1000 clock cycles to scan in the test pattern, and 3 clock cycles to capture the output of the three tests). In addition, both the transition from low to high and from high to low of the timing path may be tested in a single test of the combinational logic.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A sequential storage element for use in testing a timing path in a logic circuit, comprising:
    a first input port for receiving a scan mode signal;
    a second input port for receiving a scan input signal;
    a configuration latch, wherein a state of the scan mode signal received via the first input port determines whether the scan input signal will be latched into the configuration latch, and wherein a state of a signal latched within the configuration latch determines whether the sequential storage element will operate in a static mode or a transitional mode of operation; and
    a third input port for receiving a clock signal that latches the scan input signal into the configuration latch.

2. The sequential storage element of claim 1, further comprising:
    an output port, wherein the sequential storage element presents the scan input signal immediately on the output port if the sequential storage element is set to operate in a static mode.

3. The sequential storage element of claim 1, wherein the sequential storage element is coupled to combinational logic and wherein an output of the sequential storage element is used to test at least one timing path through the combinational logic.

4. The sequential storage element of claim 1, wherein the sequential storage element is coupled to combinational logic and wherein an output of the combinational logic is an input to the sequential storage element.

5. The sequential storage element of claim 1, wherein the scan mode signal received via the first input port is utilized to set the sequential storage element into the static mode or the transitional mode of operation.

6. A sequential storage element for use in testing a timing path in a logic circuit, comprising:
- a first input port for receiving a scan mode signal;
- a second input port for receiving a scan input signal;
- a configuration latch, wherein a state of the scan mode signal received via the first input port determines whether the scan input signal will be latched into the configuration latch, and wherein a state of a signal latched within the configuration latch determines whether the sequential storage element will operate in a static mode or a transitional mode of operation;
- a third input port for receiving a scan enable signal; and
- an output port, wherein if the sequential storage element is set to operate in the transitional mode, an output of the sequential storage element at the output port is inverted until the scan enable signal on the third input port is brought low.

7. The sequential storage element of claim 6, further comprising:
- a fourth input port for receiving a clock signal, wherein a time window is provided between a time when the scan enable signal goes low to a time when the clock signal goes high, and wherein if the output of the sequential storage element is correctly sampled during the time window, a determination is made that a circuit coupled to the sequential storage element is operating correctly.

8. The sequential storage element of claim 6, wherein the scan mode signal received via the first input port is utilized to set the sequential storage element into the static mode or the transitional mode of operation.

9. A sequential storage element for use in testing a timing path in a logic circuit, comprising:
- a first input port for receiving a scan mode signal;
- a second input port for receiving a scan input signal;
- a configuration latch, wherein a state of the scan mode signal received via the first input port determines whether the scan input signal will be latched into the configuration latch, and wherein a state of a signal latched within the configuration latch determines whether the sequential storage element will operate in a static mode or a transitional mode of operation; and
- a third input port for receiving a second scan mode signal, wherein the second scan mode signal controls a timing of a test pattern through the sequential storage element.

10. The sequential storage element of claim 9, wherein when the scan mode signal is high and the second scan mode signal is low, the scan input signal data is placed into the configuration latch.

11. The sequential storage element of claim 9, wherein when the scan mode signal is low, the second scan mode signal is high, and the configuration latch has a value indicating the static mode, an output of the sequential storage element is held and a data input to the sequential storage element is passed through unchanged.

12. The sequential storage element of claim 9, wherein when the scan mode signal is low, the second scan mode signal is high, and the configuration latch has a value indicating the transitional mode, an output of the sequential storage element is toggled and a data input to the sequential storage element is captured in a sample latch.

13. The sequential storage element of claim 9, wherein the scan mode signal received via the first input port is utilized to set the sequential storage element into the static mode or the transitional mode of operation.

14. A sequential storage element for use in testing a timing path in a logic circuit, comprising:
- a first input port for receiving a scan mode signal;
- a second input port for receiving a scan input signal;
- a configuration latch, wherein a state of the scan mode signal received via the first input port determines whether the scan input signal will be latched into the configuration latch, and wherein a state of a signal latched within the configuration latch determines whether the sequential storage element will operate in a static mode or a transitional mode of operation; and
- a sample latch, wherein when the configuration latch is set to the transitional mode, an output of the sequential storage element is toggled and a data input to the sequential storage element is latched in the sample latch.

15. The sequential storage element of claim 14, wherein when the configuration latch is set to the static mode, the output of the sequential storage element is not toggled and the data input to the sequential storage element is ignored by the sample latch.

16. A sequential storage element for use in testing a timing path in a logic circuit, comprising:
- a first input port for receiving a scan mode signal;
- a second input port for receiving a scan input signal;
- a configuration latch, wherein a state of the scan mode signal received via the first input port determines whether the scan input signal will be latched into the configuration latch, and wherein a state of a signal latched within the configuration latch determines whether the sequential storage element will operate in a static mode or a transitional mode of operation;
- a flip/flop latch; and
- an XNOR gate, wherein the flip/flop latch stores a desired value for an output of the sequential storage element and wherein the XNOR gate compares an actual output value of the sequential storage element to the desired value for the output of the sequential storage element.

17. A method of testing a timing path in a logic circuit coupled to a plurality of sequential storage elements, comprising:
- performing a configuration scan to set a first subset of the plurality of sequential storage elements to a static state and a second subset of the plurality of sequential storage elements to a transitional state;
- applying a test pattern to the plurality of sequential storage elements;
- clocking the sequential storage elements such that the test pattern is applied to the logic circuit;
- capturing output from the logic circuit along at least one timing path through the logic circuit; and
- determining if a fault is present based on the captured output, wherein
- capturing output from the logic circuit includes latching an output signal of the logic circuit into a sample latch, and
- comparing the output signal of the logic circuit latched in the sample latch to a desired output signal stored in a flip/flop latch.

18. The method of claim 17, wherein performing a configuration scan includes applying a scan mode signal to each sequential storage element in the plurality of sequential storage elements, wherein a state of the scan mode signal determines whether a scan input signal will be latched into a configuration latch, and wherein a state of a signal latched within the configuration latch determines whether a particular sequential storage element will operate in a static mode or a transitional mode of operation.

19. The method of claim 17, wherein capturing output from the logic circuit includes:
generating a time window between a time when a scan enable signal goes low and when a clock signal goes high; and
sampling an output signal of the logic circuit within the time window.

20. The method of claim 19, wherein determining if a fault is present includes determining if the sampled output signal has a transition within the time window or not.

21. The method of claim 18, wherein comparing the output signal of the logic circuit latched in the sample latch to a desired output signal stored in a flip/flop latch includes providing both the output signal of the logic circuit and the desired output signal to an XNOR gate.

* * * * *